United States Patent
Krishnan et al.

(10) Patent No.: US 8,676,140 B2
(45) Date of Patent: Mar. 18, 2014

(54) EFFICIENT SCHEME FOR AUTOMATIC GAIN CONTROL IN COMMUNICATION SYSTEMS

(75) Inventors: Subramanian Harish Krishnan, Bangalore (IN); Parag Naik, Bangalore (IN); Abdul Aziz, Bangalore (IN); Subrahmanya Kondageri Shankaraiah, Bangalore (IN)

(73) Assignee: Saankhya Labs Private Limited, Bangalore (IN)

( * ) Notice: Subject to any disclaimer, the term of this patent is extended or adjusted under 35 U.S.C. 154(b) by 0 days.

(21) Appl. No.: 13/434,671

(22) Filed: Mar. 29, 2012

(65) Prior Publication Data

US 2012/0252389 A1 Oct. 4, 2012

(30) Foreign Application Priority Data

Mar. 31, 2011 (IN) .......................... 1093/CHE/2011

(51) Int. Cl.
*H04B 1/16* (2006.01)
(52) U.S. Cl.
USPC .................. 455/234.1; 455/245.2; 455/250.1
(58) Field of Classification Search
USPC .......... 455/234.1, 234.2, 239.1, 245.1, 245.2, 455/250.1, 251.1, 254; 375/345
See application file for complete search history.

(56) References Cited

U.S. PATENT DOCUMENTS

| 7,956,933 | B2 | 6/2011 | Ohiwa |
| 8,009,776 | B2 | 8/2011 | Gao et al. |
| 8,019,027 | B2 | 9/2011 | Mada |
| 2009/0004987 | A1* | 1/2009 | Akahori ..................... 455/251.1 |
| 2011/0185394 | A1 | 7/2011 | Rakib |

* cited by examiner

*Primary Examiner* — Thanh Le
(74) *Attorney, Agent, or Firm* — Klarquist Sparkman, LLP (57) ABSTRACT

A system for controlling an RF gain of a receiver that reduces a time taken to maintain an input signal level at an optimum dynamic range is provided. The system includes a tuner that receives a radio frequency (RF) signal and down-converts the RF signal to an intermediate frequency (IF) signal, and a demodulator. The tuner includes a radio frequency programmable gain amplifier (RF_VGA), a filter and an IF programmable gain amplifier (IF_VGA). The demodulator includes an analog to digital converter (ADC), and an Automatic Gain Control (AGC) unit that (i) receives a digital signal and an IF gain of the IF_VGA. The ADC samples a filtered IF signal under oversampling conditions to obtain an oversampled signal that includes an in-band signal and an out-of-band signal. The AGC unit (ii) controls the RF_VGA, the IF_VGA and (iii) measures an RF energy of the RF signal.

13 Claims, 10 Drawing Sheets

EFFICIENT SCHEME FOR AUTOMATIC GAIN CONTROL IN COMMUNICATION SYSTEMS

BACKGROUND

1. Technical Field

The embodiments herein generally relate to electric circuits, and, more particularly, to electrical circuits for gain control by RF tuner stages in a receiver.

2. Description of the Related Art

In a wireless communication environment, a tuner is provided in receivers such as radios and televisions to tune in to a channel selected by a user. The tuner typically includes a mixer that mixes a received Radio Frequency (RF) signal with locally generated carriers to produce a predetermined Intermediate Frequency (IF) signal. Conventional tuners provide controllable options for adjusting gain at RF and IF stages. This flexibility is provided to ensure that the IF signal at the input of the data converters of the demodulator are maintained within a specified dynamic range irrespective of an input signal dynamic range, thus ensuring optimum performance.

Typically, gain at an IF or an RF stage is controlled either by applying a constant voltage on an external pin or by changing the value of a programmable gain register. Depending upon the performance required, receiving system either applies a constant voltage to a RF gain control circuit or dynamically changes a RF gain control voltage by using external circuitry. Both methods have a direct impact on the performance of the tuner as well as system cost. Although applying a constant voltage to a RF gain control circuit requires no external component and the system cost is low, the control voltage is set for a worst input case. The second approach of dynamically changing the RF gain control voltage through an external circuitry controls the RF gain depending upon the input signal scenario. Demodulators employing this method typically use an external additional RF Signal Strength Indicator (RSSI) circuit to control RF gain. This requires a wide band ADC and energy measuring circuitry and thus increases the system cost.

Figure 1:
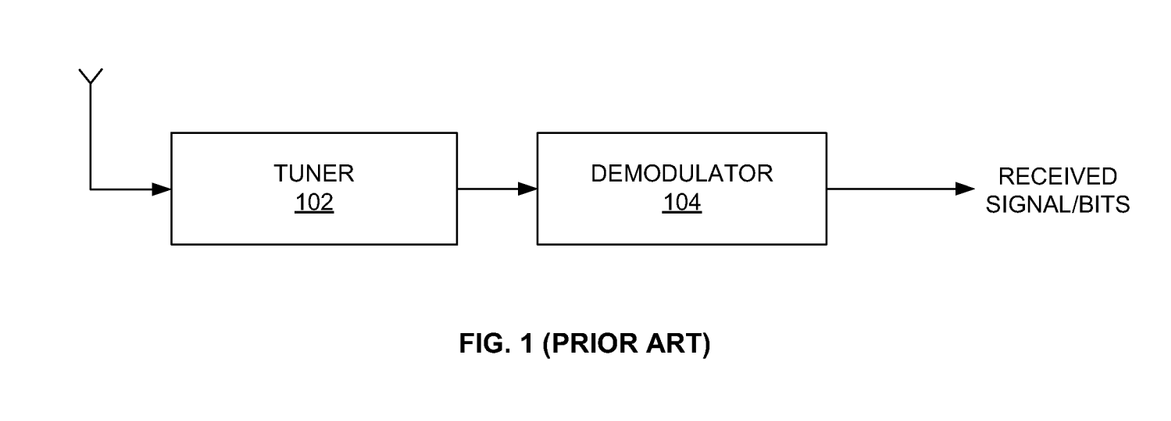
FIG. 1 illustrates a typical receiving system that includes a tuner block, and a demodulator block.

FIG. 1 illustrates a typical receiving system that includes a tuner block 102 and a demodulator block 104. The tuner block 102 down-converts the desired RF signal into a Standard IF or a Low IF or a Zero IF. The demodulator block 104 digitizes the Intermediate frequency (IF) signal and demodulates it using one or more digital signal processing algorithms. Optimal integration of the tuner block 102 and the demodulator block 104 improves the system performance. The demodulator block 104 performs optimally when inputs to the digitizer or data converters are maintained at the optimal level. This requires a constant signal level at the output of the tuner block 102 irrespective of the input signal condition.

Figure 2:
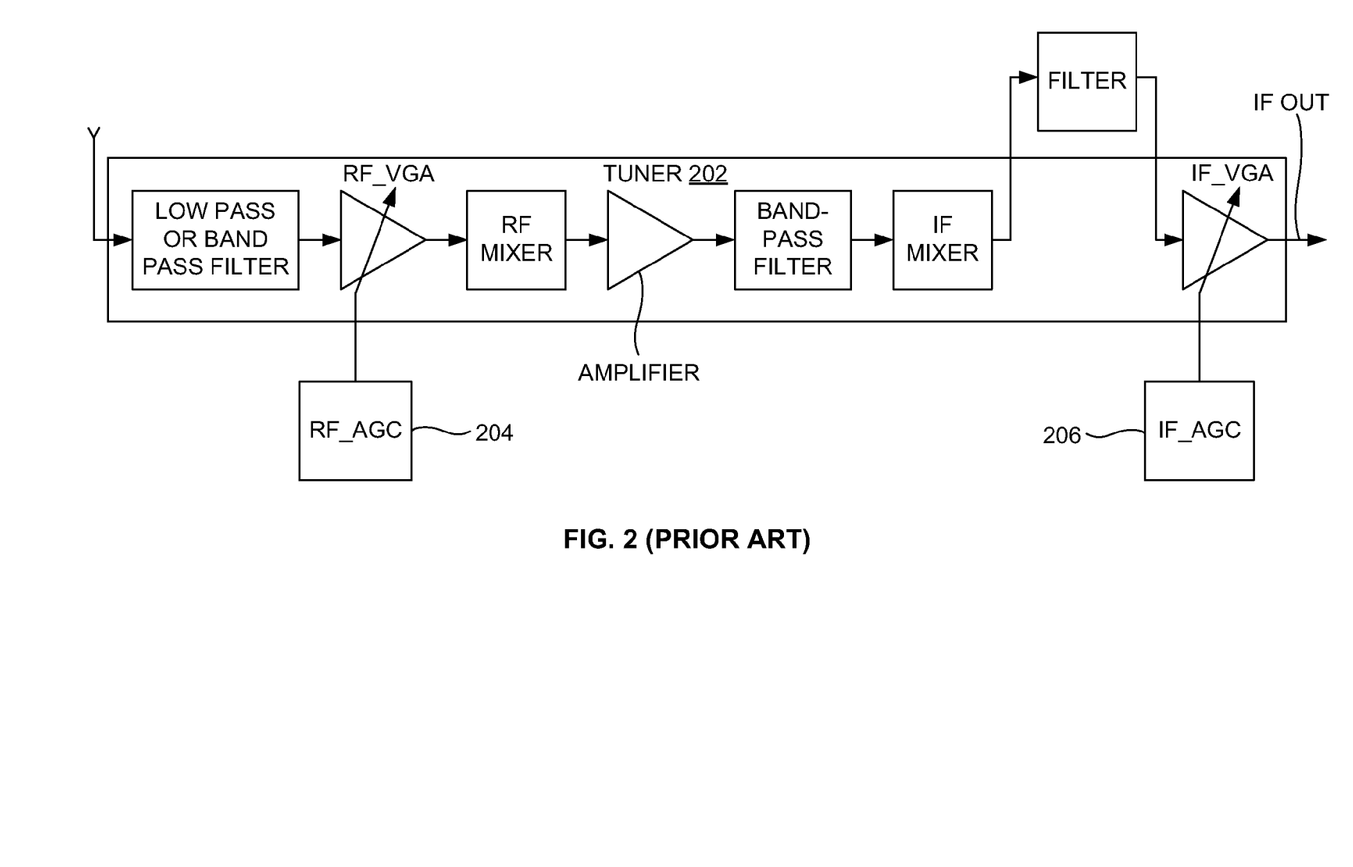
FIG. 2 illustrates a typical tuner block with a RF_VGA gain, an IF_VGA gain that are controlled by a RF_AGC block and an IF_AGC block.

FIG. 2 illustrates a typical tuner block 202 with a RF_VGA, an IF_VGA whose gains are controlled by a RF_AGC block 204 and an IF_AGC block 206 respectively. The desired RF signal level at the tuner block 202 input varies over a wide dynamic range due to near-far field problems. The tuner block 202 uses multi stage programmable gain amplifiers (e.g., VGAs) to deliver relatively constant output signal amplitude irrespective of the input signal levels. The tuner block 202 provides an external pin or a programmable register to control the gain of a VGA. An optimal gain setting is required to deliver a relatively constant output signal level.

Figure 3:
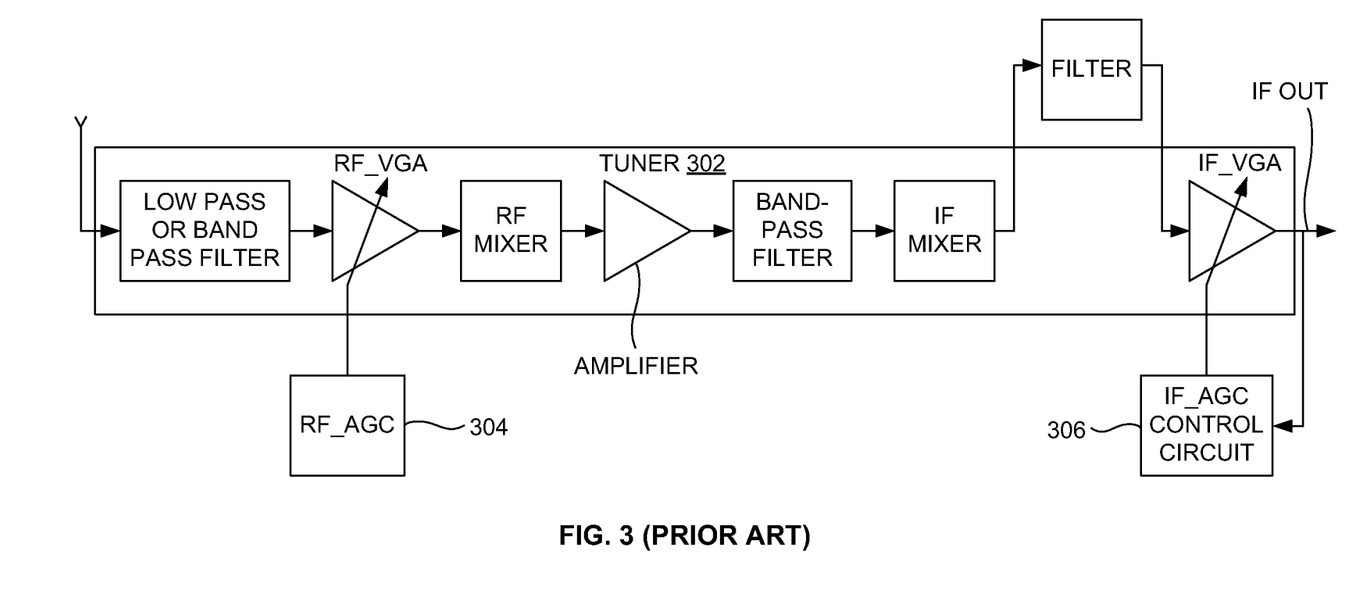
FIG. 3 illustrates another typical tuner with a RF_VGA and an IF_VGA controlled by a RF_AGC block and a IF_AGC block.

FIG. 3 illustrates another typical tuner 302 with a RF_VGA and an IF_VGA that are controlled by a RF_AGC block 304 and a IF_AGC block 306 respectively. A fixed voltage is fed as an input to the RF_AGC block 304. This fixed control voltage is derived from analyzing a worst case input condition and a performance of the tuner 302. This method is also termed as a "Fixed RF_AGC signal method" or a "Static Take-over-Point method". This arrangement does not require any external components and it reduces the cost. However, the tuner 302 will under perform for most of the input conditions as the gain control voltage value is obtained for a worst case condition.

Figure 4A:
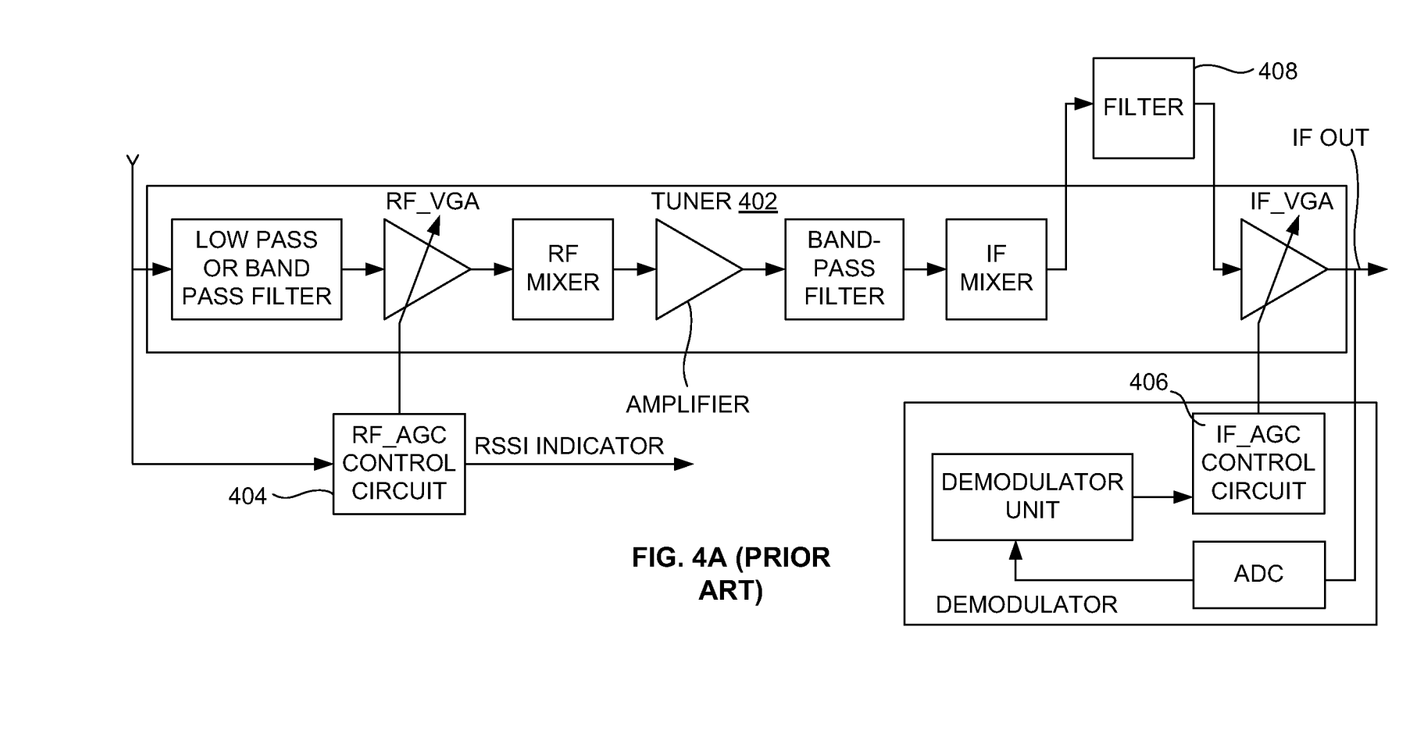
FIG. 4A illustrates a typical RF Signal Strength Indicator (RSSI) controlled tuner, having a RF_AGC control circuit, an IF_AGC control circuit, and a filter.

FIG. 4A illustrates a typical RF Signal Strength Indicator (RSSI) controlled tuner 402, having a RF_AGC control circuit 404, an IF_AGC control circuit 406, and a filter 408. The RSSI indicator signal controls the RF gain. This method will keep the RF_VGA gain at optimal level for all input condition. However the RSSI indicator uses expensive wide band ADC and RF energy measuring logic, which increases the system cost.

Figure 4B:
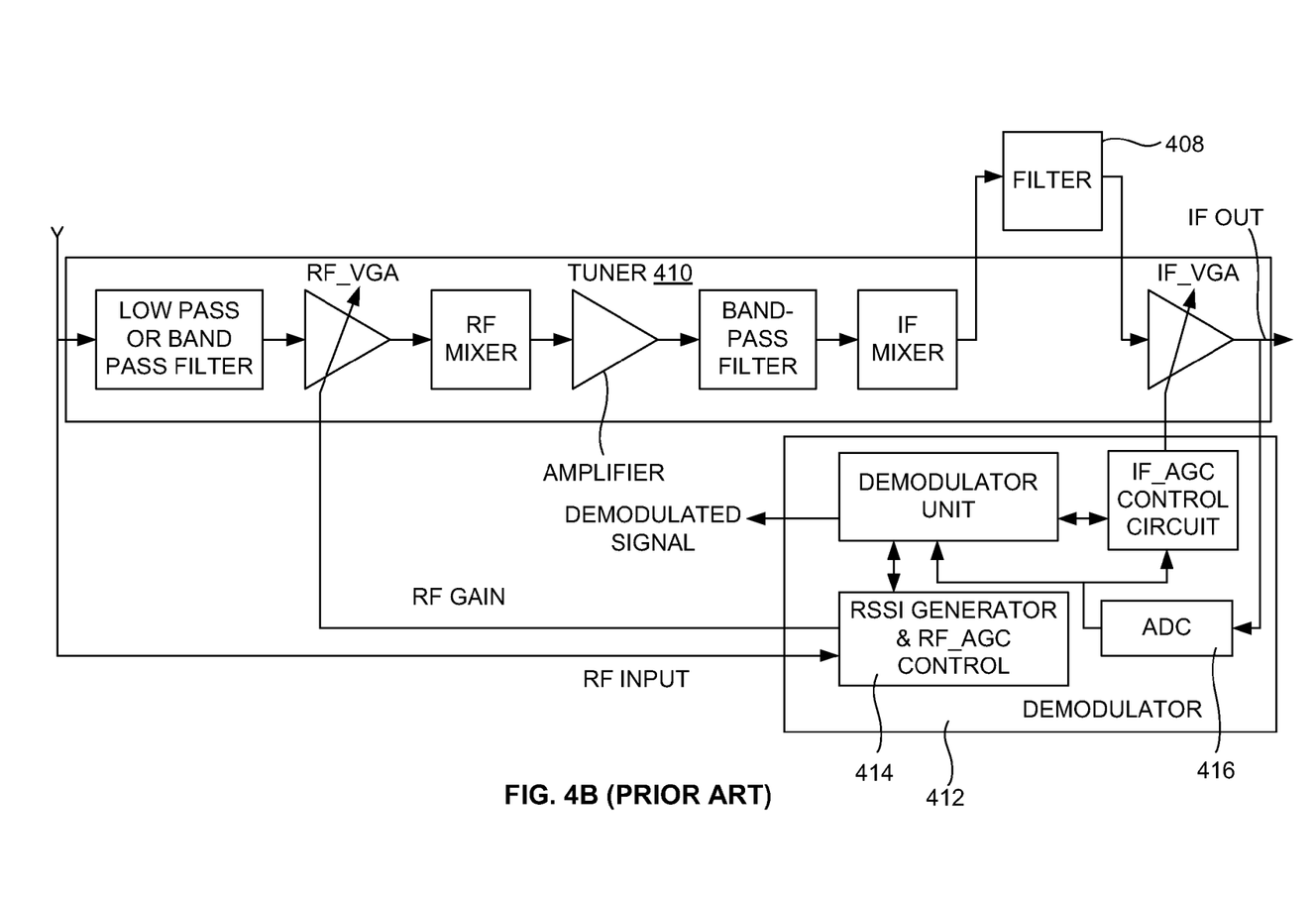
FIG. 4B illustrates a typical receiver system with a demodulator, having a RF Strength Indicator (RSSI) for optimal control of RF gain of tuner block in a demodulator.

FIG. 4B illustrates a typical receiver system with a demodulator 412, having a RF Strength Indicator (RSSI) 414 for optimal control of RF gain of tuner block in the demodulator 412. A RF input signal is fed to both a tuner 410 and the demodulator 412. The demodulator 412 digitizes the RF signal using a wideband ADC 416. An energy measurement circuitry determines the RF signal energy at the input of the tuner RF_VGA. This value is used to optimally control the RF gain of the tuner. However, this system is still expensive due to the addition of energy management circuitry.

Figure 4C:
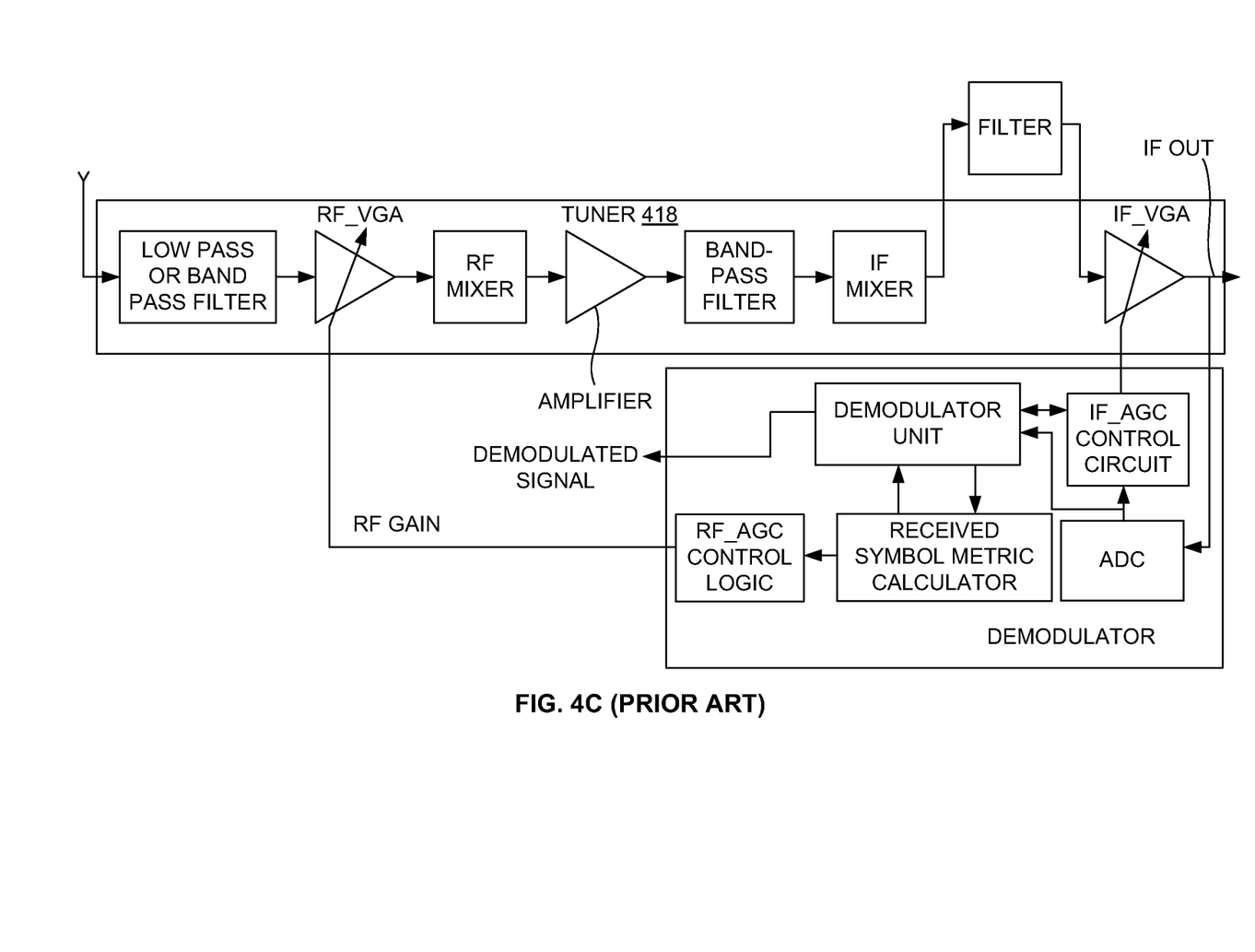
FIG. 4C illustrates a typical receiver system with an optimal RF gain setting of a tuner using a received signal metric.

FIG. 4C illustrates a typical receiver system with an optimal RF gain setting of a tuner 418 using a received signal metric. This system does not make use of expensive RSSI based RF gain control circuitry. A demodulator measures the received signal metric in terms of signal to noise ratio (SNR) or bit error rate (BER) and computes the RF gain required to achieve optimal performance. However, this system takes more time to measure SNR or BER and compute the RF gain. Accordingly, there remains a need to provide an optimal gain control for a tuner without increasing the cost of the system or increasing time for channel change.

SUMMARY

In view of foregoing embodiments herein is provided a system for controlling an RF gain of a receiver without using any external components that reduces a time taken to maintain an input signal level at an optimum dynamic range. The system includes a tuner that receives a Radio Frequency (RF) signal and down-converts the RF signal to an intermediate frequency (IF) signal, and a demodulator. The tuner further includes a radio frequency programmable gain amplifier (RF_VGA), a filter that rejects out-of-band signals from the IF signal to obtain a filtered IF signal, and an intermediate frequency programmable gain amplifier (IF_VGA). The demodulator includes an analog to digital converter (ADC) and an Automatic Gain Control (AGC) unit.

The ADC (i) converts the filtered IF signal to a digital signal and (ii) samples the digital signal under oversampling conditions to obtain an oversampled signal that includes an in-band signal and the out-of-band signal. The AGC unit (i) receives the digital signal and an IF gain of the IF_VGA. The AGC unit (ii) controls the RF_VGA and the IF_VGA, and (iii) measures a RF energy for the RF signal based on the IF_VGA gain. The IF_VGA gain (g) may be computed in accordance with an equation: $g=f(v)$, where $f(v)$ is a higher order polynomial function of a control voltage.

The RF energy may be computed by a summation of an energy of the in-band signal (Eib) and an energy of the out-of-band signal (Eob). The energy of the out-of-band may be computed in accordance with an equation: $Eob=(Edif-Eib)/(\alpha*\beta*g)$, where Edif is a received IF energy, $\alpha$ is an out-of-band attenuation, and $\beta$ is an insertion loss. The received IF energy may be computed in accordance with an equation: $Edif=(Eib+\alpha*Eob)*(\beta*g)$.

In another aspect, a system for estimating and controlling an RF gain of a receiver without using any external components that reduces a time taken to maintain an input signal level at an optimum dynamic range is provided. The system includes a tuner and a demodulator. The tuner receives a Radio Frequency (RF) signal and down-converts the RF signal to an intermediate frequency (IF) signal. The tuner further includes a radio frequency programmable gain amplifier (RF_VGA), a filter that rejects out-of-band signals from the IF signal to obtain a filtered IF signal, and an intermediate frequency programmable gain amplifier (IF_VGA). The demodulator that is coupled to the tuner converts the filtered IF signal to a digital signal.

The demodulator includes an AGC unit. The AGC unit of the demodulator (i) receives the digital signal, and an IF gain of the IF_VGA. The AGC unit (ii) controls the RF_VGA and the IF_VGA, and (iii) measures a RF energy of the RF signal based on the IF_VGA gain. The AGC unit further (iv) computes the RF gain based on the RF energy. The RF gain may also be computed based on a radio frequency optimal signal level (RF_OSL) and the RF energy.

In yet another aspect, a method for estimating and controlling an RF gain of a receiver that reduces time taken to maintain an input signal level at the optimum dynamic range is provided. The method includes (a) setting a RF gain to a typical value, (b) determining an optimal signal level in a demodulator by running an IF_AGC loop, (c) determining if the IF_AGC loop is locked based on a steadiness of the input signal and (d) computing an RF energy if the IF_AGC loop is locked. (e) A new RF gain may be calculated based on the RF energy, the RF gain and the optimal signal level in accordance with an equation:

> New RF Gain=Previous RF Gain+$K$*(RF_OSL−Erf),
> where, $K$ is a constant which controls a settling
> time of the IF_AGC loop, RF_OSL is a radio
> frequency optimal signal level and Erf is a RF
> energy of a RF signal received by a tuner.

(f) A RF gain control voltage may be set based on the new RF gain. (g) It may be determined whether an absolute function of difference between the RF_OSL and the RF energy is lesser than an RF_error_threshold. The RF_error_threshold is an error tolerance between the RF_OSL and the RF energy. (c) It may be determined whether the IF_AGC loop is locked based on the steadiness of the input signal. A hysteresis may be built around the RF gain calculation to avoid repeated switching of the RF gain.

The steps of (d) computing the RF energy if the IF_AGC loop is locked, (e) calculating the new RF gain based on the RF energy, the RF gain and the radio frequency optimal signal level, (f) setting the RF gain control voltage based on the new RF gain and (g) determining whether the absolute function of difference between the RF_OSL and the RF energy is lesser than the RF_error_threshold, are repeated only when the absolute function of difference between the RF_OSL and the RF energy is determined to be greater than the RF_error_threshold. The steps are repeated until the absolute function of difference between said RF_OSL and said RF energy is not greater than the RF_error_threshold.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need to provide an optimal gain control for a tuner without increasing cost of a system and also in a short time. The embodiments herein achieve this by measuring a RF energy of an incident RF signal and controlling an RF gain of the tuner without using any external components and without measuring received signal metrics like SNR or BER. The RF energy measurement is computed by using a wideband ADC under oversampling condition. Oversampled signal includes both an in-band (desired channel) and an out-of band energy. The out-of band signals are attenuated by one or more filters between RF and IF stage. These attenuation values are obtained through the tuner and the filter performance data. Referring now to the drawings, and more particularly to FIGS. 5 through 8, where similar reference characters denote corresponding features consistently throughout the figures, preferred embodiments are described herein.

Figure 5:
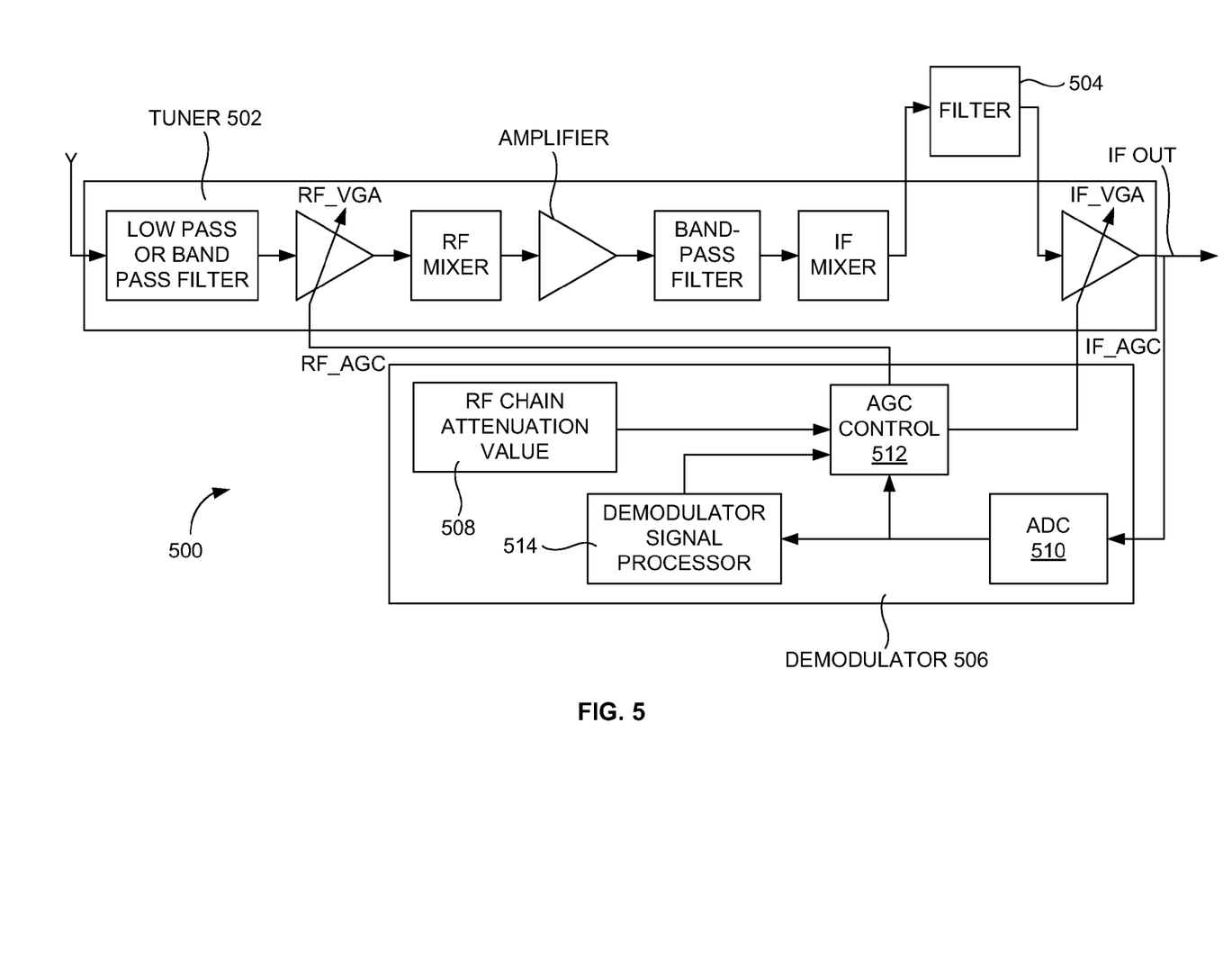
FIG. 5 illustrates a receiver having a tuner block, a filter block, and a demodulator block having internal components that include a RF Chain attenuation value block, an Analog to Digital Converter (ADC) block, an AGC control block, and a Demodulator signal processor block according to an embodiment herein.

FIG. 5 illustrates a receiver 500 having (i) a tuner block 502, (ii) a filter block 504, and (iii) a demodulator block 506 having internal components that include (a) a RF Chain attenuation value block 508, (b) an Analog to Digital Converter (ADC) block 510, (c) an AGC control block 512, and (d) a Demodulator signal processor block 514 according to an embodiment herein. RF_VGA and IF_VGA of the tuner block 502 are controlled by the AGC control block 512 of the demodulator block 506. The ADC block 510 is a wideband ADC that digitizes a filtered IF signal received as an output from the tuner block 502. The AGC control block 512 receives digitized filtered IF signal and additional inputs of the tuner block 502. The AGC control block 512 measures RF energy and controls the RF_VGA for optimal performance.

The modules between RF_VGA and IF_VGA can be modeled as a band-pass filter (BPF) with an insertion loss. Assuming, the insertion loss be β, and the out-of-band or stop band attenuation be α. The filter block 504 is the major contributor for the insertion loss (β) and attenuation of out-of band signal (α). Thus, the specification of the filter block 504 may be used as a near-accurate model for the above Band Pass Filter model. In one embodiment, the filter block 504 may be a Surface acoustic wave (SAW) filter or any band-pass filter.

The element IF_VGA as shown is characterized by its gain response. The gain of IF_VGA (IF_VGA gain) "g" can be written as:

$$g=f(v),$$

Where f(v) is typically a higher order polynomial function of control voltage. For example, $g=a_1*v$. A look-up table of voltage versus IF_VGA gain may be used instead of using gain curve. The demodulator block 506 accepts the tuner data such as BPF Model/filter insertion loss (β), BPF Model/filter Out-of-band attenuation (α), IF_VGA gain response values either as polynomial coefficients or as look-up table, and RF_OSL (Optimal Signal Level) value. The RF_OSL value can be computed using IIP3 numbers of the tuner, adjacent channel power specifications for a particular broadcast standard like ATSC and demodulator ADC dynamic range. Alternatively, the RF_OSL value can also be computed automatically by measuring intermodulation distortion products in a digitalized data.

The tuner data may be provided to the demodulator block 506 by methods such as providing programmable register which can be accessed by the demodulator signal processor block 514 through any digital interface (e.g., 2-wire protocol), and/or providing values that are used as constants during compilation of source code in case of Software Defined Radio (SDR) platform. The RF energy is measured in accordance with the equations:

$$E_{rf}=E_{ib}+E_{ob} \quad (1)$$

$$E_{ob}=(E_{dif}-E_{ib})/(\alpha*\beta*g) \quad (2)$$

$$E_{dif}=(E_{ib}+\alpha*E_{ob})*(\beta*g) \quad (3)$$

Where $E_{dif}$ is the received IF energy (digital IF), α is the out-of band attenuation, β is the insertion loss, and g is the gain of IF_VGA. Using the equations (1), (2), (3) and the tuner data, received IF energy ($E_{dif}$), In-Band Energy ($E_{ib}$), Out-of-Band Energy ($E_{ob}$), received RF Energy ($E_{rf}$) are computed. The received IF energy ($E_{dif}$) contains both in-band and out-of band energy. Energy can be computed using any of the energy detectors such as a RMS detector, an approximated RMS (e.g., exponential decaying RMS), etc.

Receiver system uses a set of filters to attenuate the adjacent channels. Signal post adjacent channel filter contains only in-band signals. Measuring the energy of in-band signal gives the in-band energy $E_{ib}$. The same energy detector should be used to compute other energies. Once $E_{dif}$ and $E_{ib}$ are computed, these values are used to compute out-of band energy using equation (3). The received RF energy ($E_{rf}$) may be computed using the values of In-band energy, and out-of band energy in equation (1). The computed RF energy ($E_{rf}$) is used to set the optimal RF gain of the tuner block 502.

Figure 6:
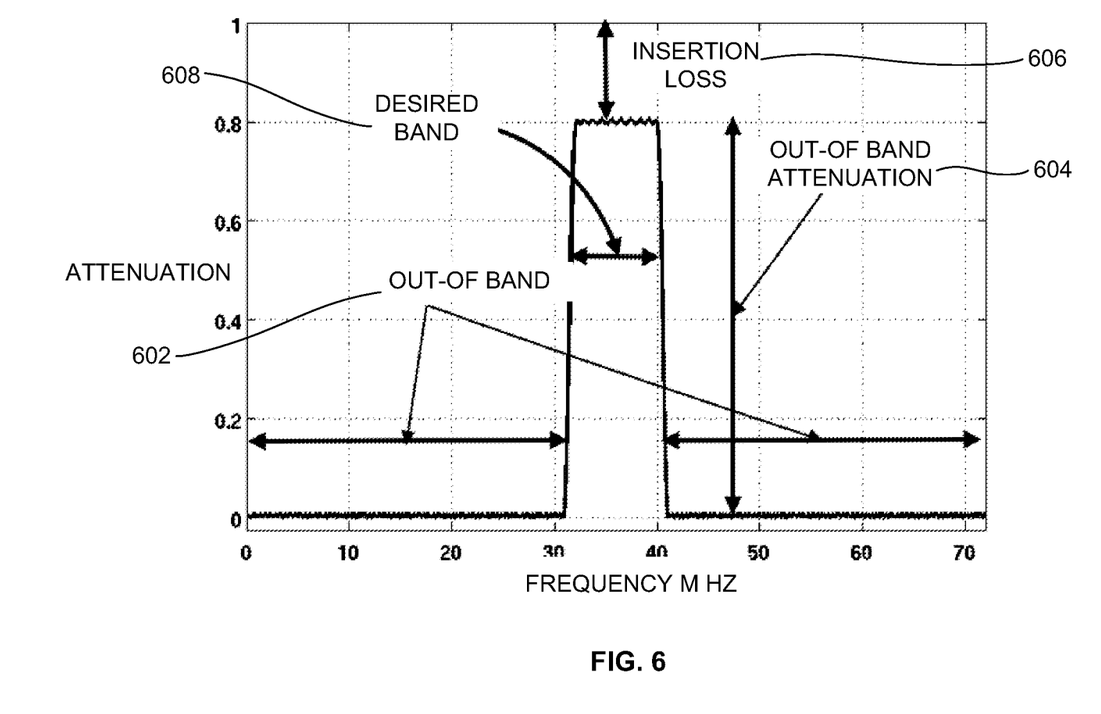
FIG. 6 is a graphical representation of a Band Pass Filter (BSF) model magnitude response of the tuner block of FIG. 5 according to an embodiment herein.

With reference to FIG. 5, FIG. 6 is a graphical representation of a Band Pass Filter (BSF) model magnitude response of the tuner block 502 of FIG. 5 according to an embodiment herein. The graphical representation includes a plot of frequency (in MHz) along x-axis and attenuation (decibel (dB) per unit length) along the y-axis. The insertion loss (β) 606, typical value between 0 dB to 3 dB. The range from 32 MHz to 42 MHz indicates a desired band 608 (energy of this band is the in-band energy ($E_{ib}$)) and the remaining frequency range indicated by 602 represents the out-of band signal (energy of this band is out-of-band energy $E_{ob}$) and are attenuated by the filter is represented as an out-of-band attenuation 604.

Figure 7:
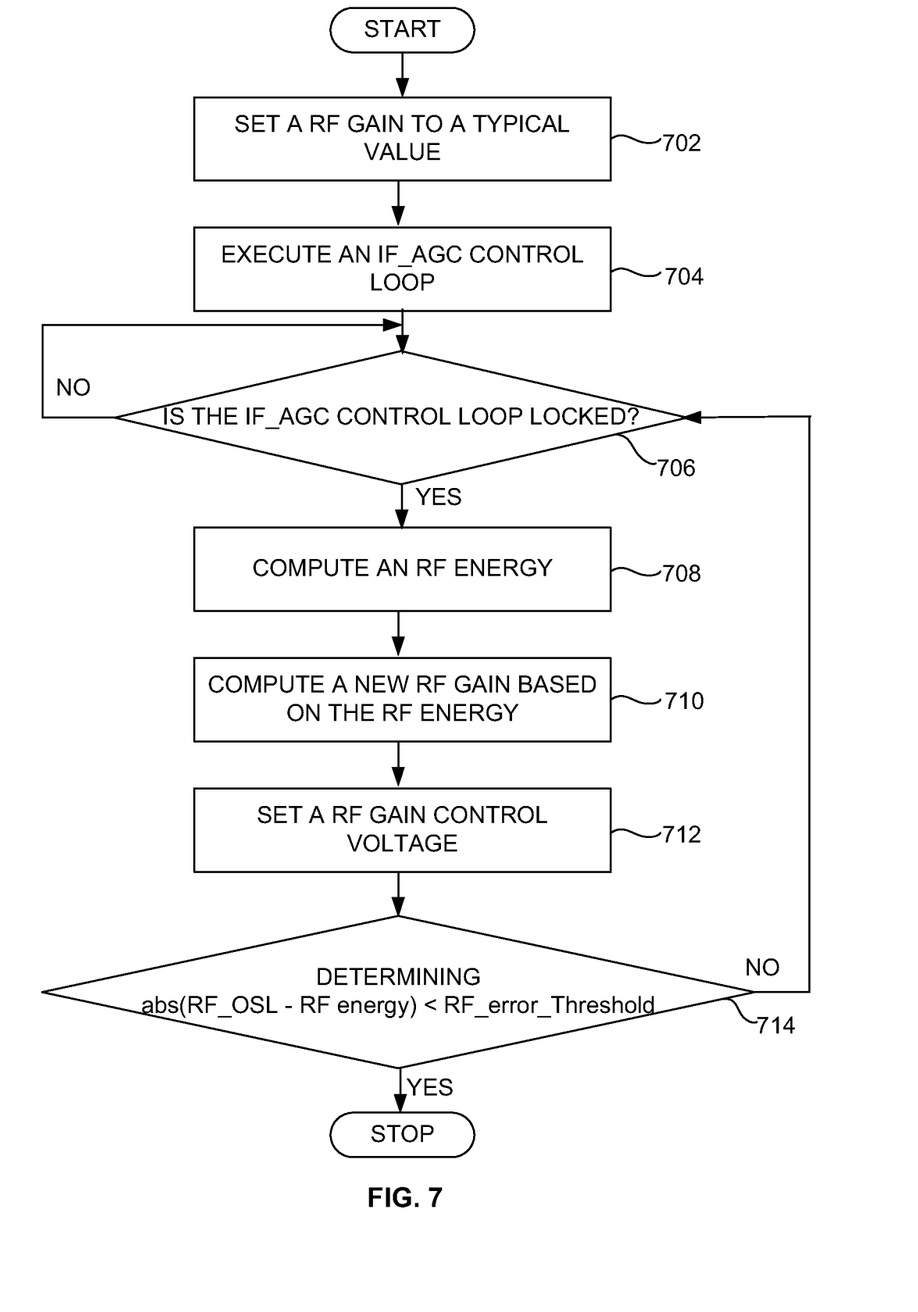
FIG. 7 is a flow chart illustrating a method of setting a RF gain in the tuner block of FIG. 5 according to an embodiment herein.

FIG. 7 is a flow chart illustrating a method of setting a RF gain in the tuner block 502 of FIG. 5 according to an embodiment herein. (i) In step 702, the RF gain is set to a typical value (e.g., 3V for most of the tuners). (ii) In step 704, IF_AGC control loop is run. The IF_AGC control loop will ensure optimal signal level at the data converters of the demodulator block 506. (iii) In step 706, it is checked whether IF_AGC control loop is locked. (iv) If the AGC control loop is locked, then the RF energy is computed (as described above in FIG. 5) in step 708. (v) Else, step 706 is repeated.

Depending upon a time constant (of the IF_AGC control loop) and an input signal level, the IF_AGC control loop will take some time to achieve steady state. The steady state gain value is required for RF energy computation. An AGC lock condition can be measured using the steadiness of AGC gain. (vi) In step 710, a new RF gain value is computed based on the RF energy in accordance with the equation:

$$\text{New RF Gain}=\text{Previous RF Gain}+K*(\text{RF\_OSL}-E_{rf})$$

Where K is constant which controls the settling time of the loop.

The new RF gain of the receiver 500 is estimated and controlled without computing signal to noise ratio (SNR) or bit error rate (BER) and without using any external component. The external components may include a pin, a programmable register, the RSSI indicator of FIG. 4A and FIG. 4B, and/or a RF energy measurement circuitry.

(vii) In step 712, a RF gain control voltage is set based on the new RF gain. Depending up on an interface provided by the tuner block 502 either this value is programmed or used to generate a control voltage. Control signal can be generated using various schemes such as pulse-width-modulation (PWM). (viii) In step 714, an RF_error_threshold is selected using an algorithm. The RF_error_threshold provides an error tolerance between the RF_OSL and the RF energy. In one embodiment, the error tolerance ranges between 0.01 to 0.1. The error tolerance of 0.01 allows selecting minimum error to be tolerated between the RF_OSL and the RF energy, whereas error tolerance of 0.1 allows selecting maximum error to be tolerated. The step 714 further includes determining whether an absolute function of difference between the RF_OSL and the RF energy is lesser than a selected RF_error_threshold between the ranges of 0.01 to 0.1. If the absolute function of difference between the RF_OSL and the RF energy is greater than the selected RF_error_threshold, the steps 706 to 712 are repeated until a minimum RF_error_threshold is achieved than the selected RF_error_threshold to maintain the input signal level at an optimum dynamic range. A hysteresis should be built around RF gain calculation to avoid repeated switching of RF gain.

Figure 8:
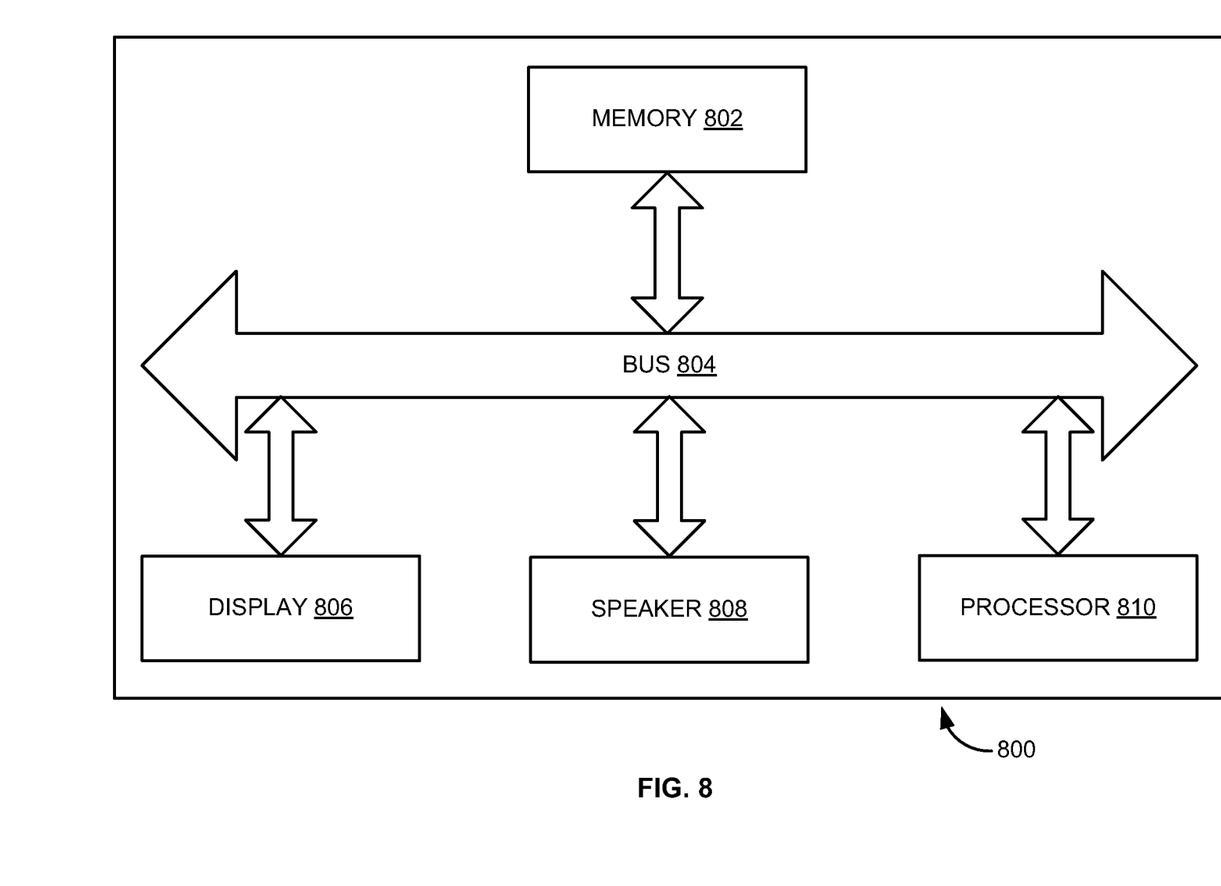
FIG. 8 illustrates an exploded view of a receiver according to an embodiment herein.

FIG. 8 illustrates an exploded view of a receiver 800 having an a memory 802 having a computer set of instructions, a bus 804, a display 806, a speaker 808, and a processor 810 capable of processing a set of instructions to perform any one or more of the methodologies herein, according to an embodiment herein. The processor 810 may also enable digital content to be consumed in the form of video for output via one or more display 806 or audio for output via speaker 808 and/or earphones. The processor 810 may also carry out the methods described herein and in accordance with the embodiments herein. Digital content may also be stored in the memory 802 for future processing or consumption. The memory 802 may also store program specific information and/or service information (PSI/SI), including information about digital content (e.g., the detected information bits) available in the future or stored from the past. A user of the receiver 800 may view this stored information on display 806 and select an item of for viewing, listening, or other uses via input, which may take the form of keypad, scroll, or other input device(s) or combinations thereof. When digital content is selected, the processor 810 may pass information. The content and PSI/SI may be passed among functions within the receiver 800 using bus 804.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A system for controlling a radio frequency (RF) gain of a receiver that reduces a time taken to maintain an input signal level at an optimum dynamic range, said system comprising:
  a tuner that receives an RF signal and down-converts said RF signal to an intermediate frequency (IF) signal, said tuner comprising:
    a radio frequency programmable gain amplifier (RF_VGA);
    a filter that rejects an out-of-band signal from said IF signal to obtain a filtered IF signal; and
    an intermediate frequency programmable gain amplifier (IF_VGA);
  a demodulator coupled to said tuner, said demodulator comprising:
    an analog to digital converter (ADC) that:
      (i) converts said filtered IF signal to a digital signal; and
      (ii) samples said digital signal under oversampling conditions to obtain an oversampled signal that comprises an in-band signal and said out-of-band signal; and
    an Automatic Gain Control (AGC) unit that:
      (i) receives said digital signal and obtains an IF gain of said IF_VGA;
      (ii) controls said RF_VGA and said IF_VGA; and
      (iii) measures an RF energy for said RF signal based on said IF gain of said IF_VGA.

2. The system of claim 1, wherein said IF gain (g) of said IF_VGA is computed in accordance with an equation: $g=f(v)$, wherein said $f(v)$ is a higher order polynomial function of a control voltage.

3. The system of claim 2, wherein said RF energy (Erf) is computed by a summation of an energy of said in-band signal (Eib) and an energy of said out-of-band signal (Eob).

4. The system of claim 3, wherein said energy of said out-of-band signal (Eob) is computed in accordance with an equation: $Eob=(Edif-Eib)/(\alpha*\beta*g)$, wherein said Edif is a received IF energy, wherein said $\alpha$ is out-of-band attenuation, and said $\beta$ is an insertion loss.

5. The system of claim 4, wherein said received IF energy (Edif)) is computed in accordance with an equation: $Edif=(Eib+\alpha*Eob)*(\beta*g)$.

6. A system for estimating and controlling a radio frequency (RF) gain of a receiver that reduces a time taken to maintain an input signal level at an optimum dynamic range, said system comprising:
  a tuner that receives an RF signal and down-converts said RF signal to an intermediate frequency (IF) signal, said tuner comprising:
    a radio frequency programmable gain amplifier (RF_VGA);
    a filter that rejects an out-of-band signal from said IF signal to obtain a filtered IF signal; and
    an intermediate frequency programmable gain amplifier (IF_VGA);
  a demodulator coupled to said tuner, wherein said demodulator converts said filtered IF signal to a digital signal, wherein said demodulator comprises an Automatic Gain Control (AGC) unit that:
    (i) receives said digital signal and an IF gain of said IF_VGA;
    (ii) controls said RF_VGA and said IF_VGA;
    (iii) measures an RF energy of said RF signal based on said IF gain of said IF_VGA; and
    (iv) computes said RF gain based on said RF energy and a radio frequency optimal signal level (RF_OSL).

7. The system of claim 6, further comprising a demodulator signal processor that determines an optimal signal level in said demodulator by running an IF_AGC loop.

8. The system of claim 7, wherein said Automatic Gain Control (AGC) unit determines whether said IF_AGC loop is locked based on a steadiness of said input signal level.

9. The system of claim 6, wherein said radio frequency optimal signal level (RF_OSL) is computed based on at least one of (i) IIP3 numbers of said tuner, (ii) adjacent channel power specifications for a particular broadcast standard that is based on ATSC and demodulator ADC dynamic range, and (iii) automatically by measuring intermodulation distortion products in a digitalized data.

10. A system for estimating and controlling a radio frequency (RF) gain of a receiver that reduces a time taken to maintain an input signal level at an optimum dynamic range, said system comprising:

a tuner that receives an RF signal and down-converts said RF signal to an intermediate frequency (IF) signal, said tuner comprising:
- a radio frequency programmable gain amplifier (RF_VGA);
- a filter that rejects an out-of-band signal from said IF signal to obtain a filtered IF signal; and
- an intermediate frequency programmable gain amplifier (IF_VGA);

a demodulator coupled to said tuner, wherein said demodulator converts said filtered IF signal to a digital signal, wherein said demodulator comprises an Automatic Gain Control (AGC) unit that:
(i) receives said digital signal and an IF gain of said IF_VGA;
(ii) controls said RF_VGA and said IF_VGA;
(iii) measures an RF energy of said RF signal based on said IF gain of said IF_VGA;
(iv) computes said RF gain based on said RF energy; and
(v) calculates a new RF gain based on said RF energy, said RF gain, and a radio frequency optimal signal level, wherein said new RF gain is computed in accordance with the equation:

$$\text{New RF Gain} = \text{Previous RF Gain} + K*(\text{RF\_OSL} - \text{Erf}),$$

wherein said K is a constant that controls a settling time of said IF_AGC loop,
wherein said RF_OSL is said radio frequency optimal signal level, wherein said Erf is said RF energy.

11. The system of claim 10, wherein said Automatic Gain Control (AGC) unit sets an RF gain control voltage based on said New RF gain.

12. The system of claim 11, wherein said Automatic Gain Control (AGC) unit determines whether an absolute function of difference between said RF_OSL and said RF energy is lesser than an RF_error_threshold, wherein said RF_error_threshold is an error tolerance between said RF_OSL and said RF energy.

13. The system of claim 10, wherein said Automatic Gain Control (AGC) unit builds a hysteresis around a calculation of said RF gain to avoid repeated switching of said RF gain.

* * * * *